(12) United States Patent
Tohda et al.

(10) Patent No.: US 6,613,680 B2
(45) Date of Patent: Sep. 2, 2003

(54) METHOD OF MANUFACTURING A SEMICONDUCTOR DEVICE

(75) Inventors: Toshiyuki Tohda, Higashiosaka (JP); Isaku Arii, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 201 days.

(21) Appl. No.: 09/908,496

(22) Filed: Jul. 19, 2001

(65) Prior Publication Data

US 2002/0039837 A1 Apr. 4, 2002

(30) Foreign Application Priority Data

Jul. 24, 2000 (JP) .......................................... 2000-222703

(51) Int. Cl.$^7$ .................... H01L 21/302; H01L 21/3065
(52) U.S. Cl. ........................ 438/703; 438/704; 438/706; 438/720; 438/723; 438/745; 438/753
(58) Field of Search ............................... 438/703, 704, 438/706, 720, 723, 745, 753

(56) References Cited

U.S. PATENT DOCUMENTS 5,444,020 A  *  8/1995  Lee et al. .................... 438/638
5,453,403 A  *  9/1995  Meng et al. ................. 438/734
5,604,156 A  *  2/1997  Chung et al. ............... 438/620

FOREIGN PATENT DOCUMENTS

JP        7-273112     10/1995
JP        8-31932      2/1996

* cited by examiner

*Primary Examiner*—Benjamin L. Utech
*Assistant Examiner*—Lynette T. Umez-Eronini
(74) *Attorney, Agent, or Firm*—Nixon & Vanderhye, P.C.

(57) ABSTRACT

A method of manufacturing a semiconductor device provided with a first insulating film and a barrier film on a conductive region and an opening portion in the first insulating film and the barrier film, the method comprising the steps of: forming a first opening portion in the barrier film reaching the first insulating film; forming a second insulating film at least on the first insulating film in the first opening portion; and forming a second opening portion smaller than the first opening portion and reaching the conductive region by simultaneously boring a hole into the first insulating film and the second insulating film in the first opening portion.

8 Claims, 3 Drawing Sheets

METHOD OF MANUFACTURING A SEMICONDUCTOR DEVICE

CROSS-REFERENCE TO RELATED APPLICATION

This application is related to Japanese application No. 2000-222703 filed on Jul. 24, 2000, whose priority is claimed under 35 USC § 119, the disclosure of which is incorporated by reference in its entirety.

BACKGROUND OF THE INVENTION

1. Field of the Invention

The present invention relates to a method of manufacturing a semiconductor device. More particularly, the invention relates to processing of a barrier film at a contact hole etching step (etching step for forming a contact hole).

2. Description of the Related Art

In recent years, a semiconductor device has been made minute and multifunctional. With this, a phenomenon in which functions of various functional components formed in the semiconductor device are deteriorated by harmful elements, molecules, and the like, has become remarkable. As measures against this, there has been adopted a method for protecting the functional components against the harmful elements, molecules and the like by various protection films (barrier films). As constituent materials of the barrier films, $Al_2O_3$ (alumina), $TiO_2$, TiN, TiON, $Ta_2O_5$, TaSiN, SiN and the like can be enumerated. One of these barrier films blocks the penetration of a harmful material by the dense film, and another takes a harmful material in the film to trap it. However, there is a problem that the barrier films prevent etching in a subsequent processing step or produce reactive secondary product materials (deposited materials) during the etching.

Hereinafter, an example of the prior art will be described with reference to FIGS. 3A to 3C.

First, a resist pattern 26 for contact hole formation is formed in a state where an NSG film 22, a BPSG film 23, an alumina film (barrier film) 24, and an NSG film 25 are deposited over a silicone (Si) substrate 21 on which various functional components (not shown) are formed (FIG. 3A). In this case, what is barriered by the alumina film 24 is not limited to a semiconductor component formed just on the Si substrate 21, but all functional components under the alumina film 24 are barriered.

Conventionally, in a subsequent contact hole etching, the alumina film and a Si oxide films (NSG film and BPSG film) are dry etched at the same time under normal conditions for etching the Si oxide films, for example, by a gas including a fluorine based gas in plasma etching such as RIE. As an example of existing techniques, although the alumina film is not used for a barrier, an example of Japanese Unexamined Patent Publication No. Hei. 8 (1996)-31932 discloses a similar step. In this case, etching is stopped in the alumina film, or a reactive secondary product material (deposited material) 27 produced from alumina is deposited on the bottom of a contact hole (FIG. 3B).

The deposited material prevents electrical contact between the Si substrate and a metal wiring of an upper layer, and must be removed before the wiring is formed in the contact hole. As a conventional method, the deposited material is removed by a treatment using chemicals (for example, EKC270 of EKC Technology Inc., etc.) capable of dissolving the deposited material, or by physically impacting inert molecules of Ar or the like, ions, radicals or the like to the deposited material to make scattering (called sputter etching, inverse sputtering, or the like).

However, the conventional methods have problems. That is, both the deposited material removal by the chemicals and the deposited material removal by the sputter etching have an etching rate with respect to the Si substrate of the bottom of the contact hole (see Table 1). Thus, there arise problems that a damage 28 is caused (FIG. 3C) at the bottom of the contact hole (surface of the Si substrate), and the contact resistance becomes unstable from fluctuation in the removable state of the deposited material.

TABLE 1

|  | Si etching rate |
| --- | --- |
| EKC270 | 10 Å/min |
| Ar sputter | 200 Å/min |

As another example of the prior art, as in an embodiment of Japanese Unexamined Patent Publication No. Hei. 7 (1995)-273112, a method is also conceivable in which etching of the alumina film is carried out by changing a gas and by a gas containing chlorine. In the etching by the gas containing chlorine, the etching rate of the alumina film is fast, and an etching stop in the alumina film does not occur. However, the mechanism in which the deposited material is produced is not changed, and since a similar treatment for the deposited material becomes necessary, the superiority is not high.

Incidentally, in the foregoing description of the prior art and the problems, the same is the case with a barrier film (film made of $TiO_2$, TiN, TiON, $Ta_2O_5$, TaSiN, or SiN) other than the alumina film.

As described above, in the etching of the contact hole containing the barrier film, it is necessary to obtain contact hole etching conditions under which the deposited material is not produced from the barrier film, or to conceive a method in which the deposited material is effectively and certainly removed without damage.

SUMMARY OF THE INVENTION

According to the present invention, there is provided a method of manufacturing a semiconductor device provided with a first insulating film and a barrier film on a conductive region and an opening portion in the first insulating film and the barrier film, the method comprising the steps of:

forming a first opening portion in the barrier film reaching the first insulating film;

forming a second insulating film at least on the first insulating film in the first opening portion; and forming a second opening portion smaller than the first opening portion and reaching the conductive region by simultaneously boring a hole into the first insulating film and the second insulating film in the first opening portion.

One of the features of the present invention is that the barrier film is removed more extensively than the second opening portion in advance to suppress the production of a deposited material in the opening portion at the etching for forming the second opening portion (contact hole), so that the barrier film which causes deposit in the contact hole is not exposed at the etching of the second opening portion.

Further, according to the present invention, the step of forming the first opening portion in the barrier film reaching the first insulating film may comprise covering the barrier film with a third insulating film, forming a resist pattern by using a mask for forming the second opening portion, forming a pattern for forming the first opening portion on the third insulating film by using the resist pattern, and forming the first opening portion in the barrier film by using the pattern for forming the first opening portion.

According to the above method, since the formation of the first opening portion can be made by using the second opening portion formation mask, the number of masks to be used can be decreased.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
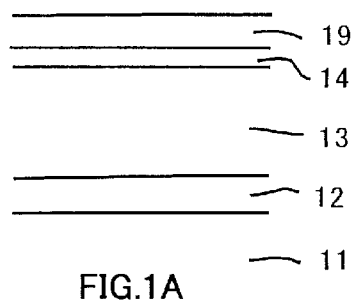
FIGS. 1A to 1H are a schematic sectional view illustrating steps of a method of manufacturing a semiconductor device according to Example 1.

In the present invention, after the formation of a barrier film (there is also a case where a thin insulating film as a protection layer of the barrier film is formed on the barrier film), portions other than a part where a contact hole is formed at a subsequent step are covered with a photoresist (resist pattern), and the barrier film of only the part where the contact hole is formed is removed by etching using the photoresist as a mask. As a method of removing the barrier film, dry etching+deposited material removing method can be used. An area where the barrier film is removed is also referred to as a first opening portion below.

As the dry etching, plasma etching under general contact hole etching conditions of an interlayer insulating film, for example, by an etching gas including a fluorine based gas ($CF_4$, $CHF_3$, $C_2F_6$, $C_3F_8$, $C_4F_8$, $SF_6$, etc.), or plasma etching under metal wiring etching conditions, for example, by an etching gas including a chlorine based gas ($Cl_2$, $BCl_3$, etc.) can be applied.

Although the deposited material is produced in the above dry etching as described above, like the data of Table 2, under barrier film etching conditions (etchant: $CF_4+CHF_3+Ar$), if etching rates of the barrier film (in this case, an alumina film) and the first insulating film (under layer insulating film, in this case, a silicon oxide film) are stable, it is easy to suppress a film decrease in the first insulating film by controlling an overetching amount at the etching of the barrier film. In this way, if the first insulating film of a sufficient thickness remains up to the conductive region formed in the substrate or the like, even if a chemical treatment or sputter etching is carried out as a deposited material removing treatment, since the chemicals or elements do not come in direct contact with the conductive region, there does not occur such a problem that damage or the like is caused in the conductive region.

TABLE 2

| | Etching rate (Å/min) | |
|---|---|---|
| | center portion of wafer | peripheral portion of wafer |
| $Al_2O_3$ film | 1028 | 1040 |
| $SiO_2$ film | 6760 | 6720 |

It is preferable that the removing area diameter (diameter of the first opening portion) of the barrier film is larger than a design value of the diameter of the second opening portion by fluctuations in the process, such as an alignment shift (phenomenon where superposition with an under layer is off) at the time of photolithography step of the first opening portion (at the time of formation of a resist mask by a photolithography method), an alignment shift at the time of photolithography step of the second opening portion, a fluctuation in a diameter after the photolithography step of the second opening portion, and a shift of the diameter of the opening portion by etching. Specific examples are shown in Table 3.

TABLE 3

| Design value of diameter of second opening portion (μm) | Photolitho-graphy fluctuation of diameter of second opening portion (μm) | Alignment shift at photolitho-graphy step of second opening portion (μm) | Etching shift of diameter of second opening portion (μm) | Alignment shift at photolitho-graphy step of diameter of first opening portion (μm) | Diameter of first opening portion (μm) |
|---|---|---|---|---|---|
| 0.6 | ±0.06 | 0.1 or less | 0.1 ± 0.05 | 0.1 or less | 1.01 or more |
| 0.3 | ±0.03 | 0.05 or less | 0.1 ± 0.05 | 0.05 or less | 0.58 or more |

By removing the barrier film of the area exceeding the barrier film removal area in Table 3, it is possible to prevent the barrier film from being exposed in the contact hole at the time of contact hole etching with respect to any process fluctuation.

In order to remove the barrier film in a large area, generally, it is necessary to prepare a new photomask (mask for resist pattern formation) of a wide opening area. However, as a method of removing a barrier film in a wide area without preparing a new mask, there is a following method. First, after the barrier film is formed, a third insulating film is formed thereon. Contact photolithography step is carried out by using a photomask for contact hole formation thereon to form a resist pattern, and next, the third insulating film on the barrier film is wet etched by chemicals using the resist pattern. For example, if the third insulating film is a Si oxide film, it is suitable to use a HF solution (diluted HF solution, diluted BHF solution, etc.). An opening of a desired size is formed in the third insulating film by the wet etching, and then, the photoresist mask is removed, and when the barrier film is dry etched by using the third insulating film as a mask, the barrier film can be removed at a desired diameter.

According to the method of the present invention, at the contact hole etching step, the aspect ratio of the contact hole formed in the first insulating film can be decreased by the barrier film thickness+the film decrease of the first insulating film by over etching at the removal of the barrier film. As a result, a process margin can be increased.

After the barrier film is partially removed by the foregoing method, the deposited material is removed by a chemical treatment or inverse sputtering, and further, the second insulating film is deposited, and contact photolithography step and dry etching are carried out, so that the contact hole is formed. According to the method of the present invention, since the barrier film is not exposed during the dry etching, the deposited material by the barrier film is not produced, and the contact hole with an excellent shape can be formed.

Incidentally, as respective structural elements of the semiconductor device, material and film thickness well known in the field can be adopted. Further, the formation method and processing method of those can be suitably selected from well-known methods in accordance with the material and film thickness constituting the respective structural elements.

Specifically, as the first insulating film, the second insulating film, and the third insulating film, a silicon oxide film, a silicon nitride film, an NSG film, a BSG film, a PSG film, a BPSG film, and the like can be enumerated. Further, these insulating films may be composed of a plurality of layers. Besides, it is preferable that the thicknesses of the first insulating film, the second insulating film, and the third insulating film are 200 to 1500 nm, 100 to 1000 nm, and 50 to 1000 nm, respectively.

Further, as the barrier film, films made of $Al_2O_3$, $TiO_2$, TiN, TiON, $Ta_2O_5$, TaSiN, SiN, and the like can be enumerated. It is preferable that the thickness of the barrier film is 10 to 300 nm.

The conductive region means a region where electrical conduction is desired, such as a source, a drain, and a gate of a transistor. Besides, the conductive region means not only a region formed on the substrate, but also a conductive region formed in an interlayer insulating film.

Hereinafter, the present invention will be described in detail on examples.

EXAMPLE 1

FIGS. 1A to 1H are schematic views showing manufacturing steps of a semiconductor device according to example 1.

First, after a semiconductor component (not shown) is formed on a Si substrate 11, an NSG film 12 having a thickness of 100 nm and a BPSG film 13 having a thickness of 700 nm are deposited by an atmospheric pressure CVD method, respectively. A functional component (not shown) is formed on the BPSG film 13, an alumina film (barrier film) 14 having a thickness of 30 nm is formed thereon by a sputtering method, and an NSG film 19 having a thickness of 50 nm is deposited by the atmospheric pressure CVD method (FIG. 1A). The NSG film 12 and the BPSG film 13 correspond to the first insulating film.

Figure 1B:
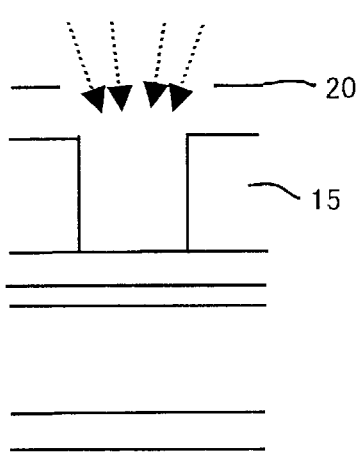

Next, a photoresist film having a thickness of 1 μm is coated on the NSG film 19 by spin coating, and is baked to form a film. Next, the photoresist film is exposed by using a new photomask 20 capable of forming an opening in an area with a diameter larger than a diameter of a subsequent contact hole by all fluctuations caused in the process (for example, when the contact hole diameter is 0.6 μm, the opening diameter of the new photomask is 1.01 μm or more) and is developed, so that a resist pattern 15 is obtained (FIG. 1B).

Subsequently, the NSG film 19, the alumina film 14, and a part (30 nm thickness) of the BPSG film 13 are dry etched under contact hole etching conditions by using the resist pattern 15 as a mask. For example, in the case where the etching is carried out by an RIE apparatus under conditions of RF Power=780 W, Pressure=225 mTorr, etching gases and their flow rates of $CF_4$/$CHF_3$/Ar=27/27/400 sccm, when the etching rate of the NSG film is 5200 Å/min, the etching rate of the alumina film is 1034 Å/min, and the etching rate of the BPSG film is 7200 Å/min, it becomes necessary that the etching time is about 26 seconds. By this etching, a first opening portion is formed.

Figure 1C:
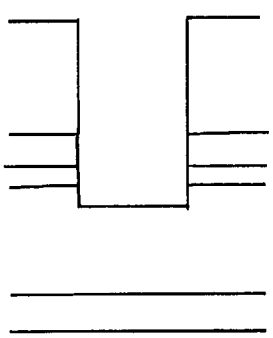

Next, a deposited material produced from alumina is removed by chemicals (FIG. 1C). As a removing method, for example, a method can be cited in which EKC270 is heated to 70° C., a sample is immersed therein for 5 minutes, and then, it is washed by pure water for 30 minutes, and is dried by a spin dryer.

Figure 1D:
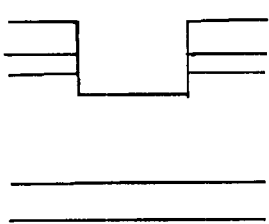

Subsequently, the resist pattern 15 remaining after dry etching is removed (FIG. 1D). As a removing method, for example, ashing by $O_2$, washing by organic solvent, sulfuric acid boil, or combination thereof can be cited.

Figure 1E:
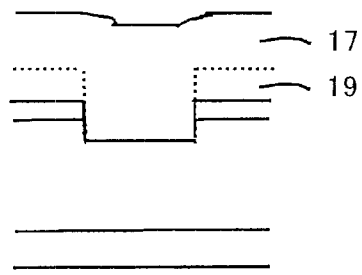

Thereafter, an NSG film 17 having a thickness of 450 nm is deposited by the atmospheric pressure CVD method (FIG. 1E). The NSG films 19 and 17 corresponding to the second insulating film.

Figure 1F:
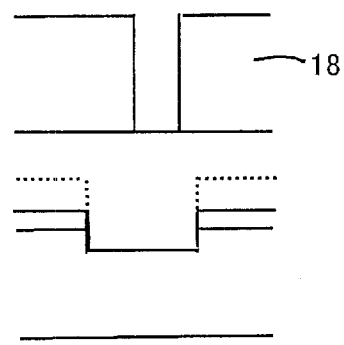

Then, a photoresist film having a thickness of 1 μm is coated on the laminated NSG film 17 by the spin coating to form a film. Next, exposure and development are carried out by using a contact hole formation photomask, so that a resist pattern 18 for contact hole etching is formed (FIG. 1F).

Figure 1G:
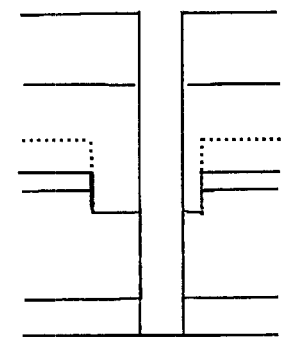

Subsequently, the NSG film 17, the BPSG film 13, and the NSG film 12 are etched by using the formed resist pattern 18 as a mask, so that a contact hole (second opening portion) is formed (FIG. 1G). For example, in the case where the etching is carried out by an RIE apparatus under conditions of RF Power=780 W, Pressure=225 mTorr, etching gases and their flow rates of $CF_4$/$CHF_3$/Ar=27/27/400 sccm, it becomes necessary that the etching time is about 200 seconds. In this case, the opening area of the previously removed alumina film is larger than the actual contact hole diameter and includes the area for the case where the alignment at the time of photolithography is shifted or the contact hole diameter becomes large by the etching, so that the alumina film is not exposed during the contact hole etching.

Figure 1H:
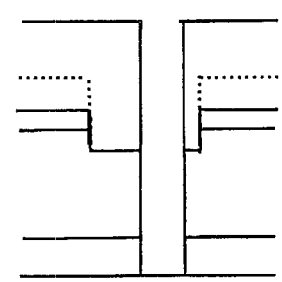

Finally, the resist pattern 18 after the etching is removed (FIG. 1H). As a removing method, for example, ashing by $O_2$, washing by organic solvent, sulfuric acid boil, or combination of those can be cited.

EXAMPLE 2

FIGS. 2A to 2H are schematic views showing manufacturing steps of a semiconductor device according to example 2.

Figure 2A:
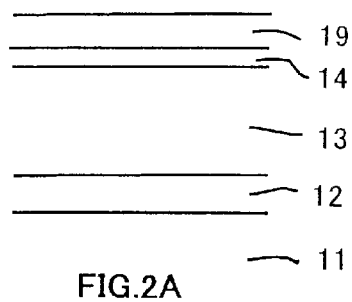
FIGS. 2A to 2H are a schematic sectional view illustrating steps of a method of manufacturing a semiconductor device according to Example 2.

First, after a semiconductor component is formed on a Si substrate 11, an NSG film 12 having a thickness of 100 nm and a BPSG film 13 having a thickness of 700 nm are deposited by an atmospheric pressure CVD method, respectively, and a functional component (not shown) is formed thereon. Then, an alumina film 14 having a thickness of 30 nm is formed on the functional component by a sputtering method, and an NSG film (third insulating film) 19 having a thickness of 200 nm is deposited by the atmospheric pressure CVD method (FIG. 2A).

Next, a photoresist film having a thickness of 1 μm is coated on the NSG film 19 by a spin coating method to form a film. The photoresist film is exposed by using a contact hole formation photomask 16 and is developed, so that a resist pattern 15 is obtained. Next, the NSG film 19 is wet etched by 10:1 BHF solution. Here, when the NSG wet etching rate of 10:1 BHF is 200 nm/min, and when etching is carried out for 75 seconds, an opening of a diameter larger than the opening diameter of the photoresist pattern 15 by 0.5 μm is formed in the NSG film (FIG. 2B).

Figure 2E:
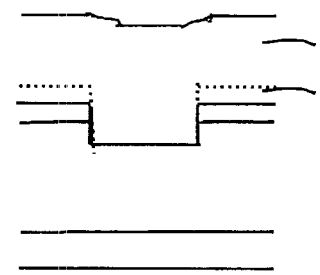
Figure 2B:
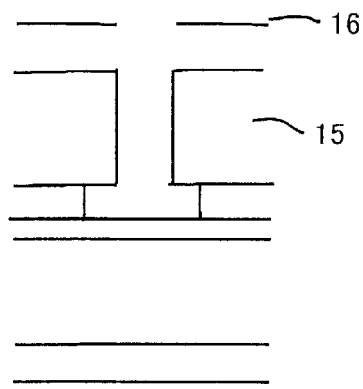
Figure 2F:
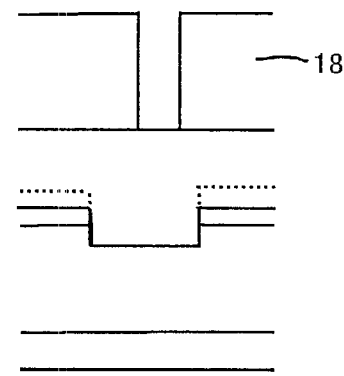
Figure 2C:
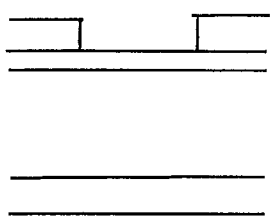

Subsequently, the resist pattern 15 is removed (for example, ashing by $O_2$, washing by organic solvent, sulfuric acid boil, or combination of those) (FIG. 2C).

Subsequently, the alumina film 14 and a part (30 nm thickness) of the BPSG film 13 are dry etched under contact hole etching conditions by using the NSG film 19 as a mask. For example, in the case where the etching is carried out by an RIE apparatus under conditions of RF Power=780 W, Pressure=225 mTorr, etching gases and their flow rates of $CF_4/CHF_3/Ar$=27/27/400 sccm, when the etching rate of the NSG film is 5200 Å/min, is 5200 the etching rate of the alumina film is 1034 Å/min, and the etching rate of the BPSG film is 7200 Å/min, it becomes necessary that the etching time is about 20 seconds. In this case, there remains the NSG film 19, which became the mask, of a thickness of 27 nm. Next, a deposited material produced from alumina is removed by chemicals (FIG. 2D). As a removing method, a method can be cited in which for example, EKC 270 is heated to 70° C., and a sample is immersed therein for 5 minutes, and thereafter, it is washed by pure water for 30 minutes, and is dried by a spin drier.

An NSG film (second insulating film) 17 having a thickness of 500 nm is deposited on the whole surface by the atmospheric pressure CVD method (FIG. 2E).

Thereafter, a photoresist film having a thickness of 1 μm is coated on the NSG film 17 by the spin coating to form a film. Next, the photoresist film is exposed by using the contact hole formation photomask 16 and developed, so that a resist pattern 18 for contact hole etching is formed (FIG. 2F).

Figure 2G:
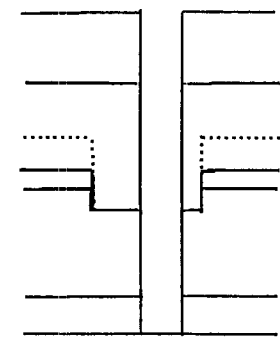
Figure 2D:
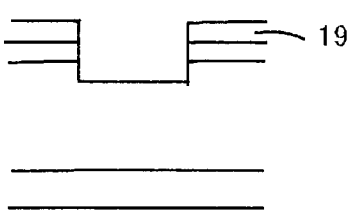

Subsequently, contact hole etching is carried out by using the formed resist pattern 18 as a mask (FIG. 2G). For example, in the case where the etching is carried out by an RIE apparatus under conditions of RF Power=780 W, Pressure=225 mTorr, etching gases and their flow rates of $CF_4/CHF_3/Ar$=27/27/400 sccm, it becomes necessary that the etching time is about 200 seconds. In this case, the opening area of the previously removed alumina film is larger than the actual contact hole diameter and includes the area for all fluctuations caused in the process, such as the case where the alignment at the time of photolithography is shifted or the contact hole diameter becomes large by the etching, so that the alumina film is not exposed during the contact hole etching.

Figure 2H:
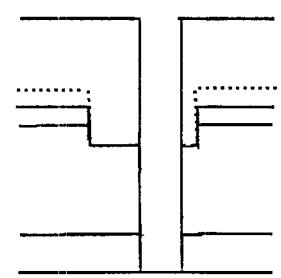
Figure 3A:
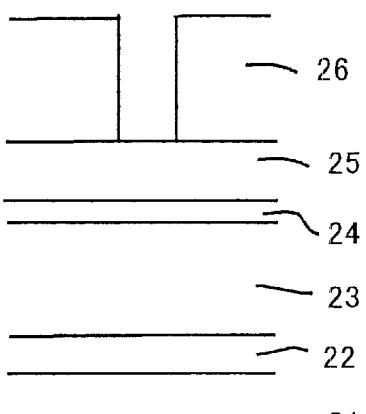
FIGS. 3A to 3C are a schematic sectional view illustrating steps of a prior art method of manufacturing a semiconductor device.
Figure 3B:
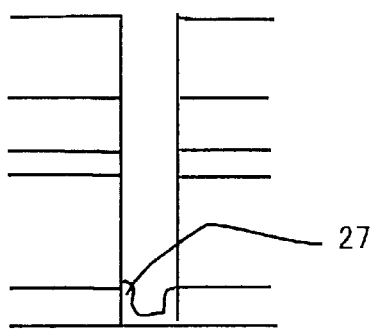
Figure 3C:
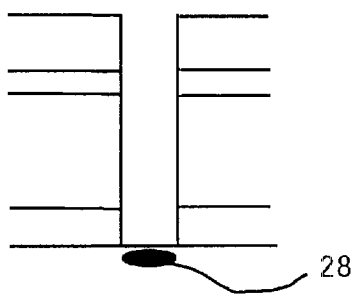

Finally, the resist pattern 18 after the etching is removed (FIG. 2H). As a removing method, for example, ashing by $O_2$, washing by organic solvent, sulfuric acid boil, or combination of those can be cited.

In the example 1, although two photomasks become necessary for the formation of the resist patterns 15 and 18, since the alumina film 14 and the NSG film 19 can be simultaneously etched using the resist pattern 15, the steps can be decreased.

Besides, in the example 2, although the alumina film 14 and the NSG film 19 are etched by the separate steps, the resist patterns 15 and 18 can be formed by one photomask.

In accordance with a semiconductor device to be manufactured and for the purpose of reducing the cost, the methods of the examples 1 and 2 can be suitably selected.

Besides, in any method of the examples 1 and 2, it is possible to prevent the deposited material from adhering to the Si substrate at the time of subsequent contact hole formation by removing the deposited material produced from alumina after etching of the alumina film. As a result, it is possible to prevent the phenomenon in which the contact resistance becomes unstable by adhesion of the deposited material to the Si substrate.

As described above, since a part of the barrier film, which has such a diameter that the alumina film is not exposed at the time of contact etching, is removed by dry etching in advance, an excellent contact hole without poorness and defects caused by the deposited material from the barrier film can be formed.

What is claimed is:

1. A method of manufacturing a semiconductor device provided with a first insulating film and a barrier film on a conductive region and an opening portion in the first insulating film and the barrier film, the method comprising the steps of:

forming a first opening portion in the barrier film reaching the first insulating film;

forming a second insulating film at least on the first insulating film in the first opening portion; and forming a second opening portion smaller than the first opening portion and reaching the conductive region by simultaneously boring a hole into the first insulating film and the second insulating film in the first opening portion.

2. A method according to claim 1, wherein the step of forming the first opening portion in the barrier film reaching the first insulating film is comprised of:

covering the barrier film with a third insulating film;

forming a resist pattern by using a mask for forming the second opening portion;

forming a pattern for forming the first opening portion on the third insulating film by using the resist pattern; and forming the first opening portion in the barrier film by using the pattern for forming the first opening portion.

3. A method according to claim 1, wherein a deposit accumulated in the first opening portion during the formation of the first opening portion is removed after the formation of the first opening portion and before the formation of the second insulating film.

4. A method according to claim 1, wherein the barrier film is a film made of $Al_2O_3$, $TiO_2$, TiN, TiON, $Ta_2O_5$, TaSiN or SiN.

5. A method according to claim 1, wherein the first and the second opening portions are formed by dry etching.

6. A method according to claim 2, wherein the first opening portion is formed by wet etching and the second opening portion is formed by dry etching.

7. A method according to claim 1, wherein the first and the second insulating film is a silicon oxide film, a silicon nitride film, a NSG film, a BSG film, a PSG film or a BPSG film.

8. A method according to claim 2, wherein the third insulating film is a silicon oxide film, a silicon nitride film, a NSG film, a BSG film, a PSG film or a BPSG film.

* * * * *